(12) United States Patent
Raymond et al.

(10) Patent No.: US 7,233,871 B2
(45) Date of Patent: Jun. 19, 2007

(54) INSPECTION WINDOW GUARD BANDING

(75) Inventors: Douglas W. Raymond, Orinda, CA (US); Richard D. Fleming, Walnut Creek, CA (US); John Haddon, Berkeley, CA (US); Dominic F. Haigh, San Francisco, CA (US)

(73) Assignee: Landrex Technologies Co., Ltd., Taipei (TW)

( * ) Notice: Subject to any disclaimer, the term of this patent is extended or adjusted under 35 U.S.C. 154(b) by 268 days.

(21) Appl. No.: 10/385,079

(22) Filed: Mar. 10, 2003

(65) Prior Publication Data
US 2004/0181352 A1   Sep. 16, 2004

(51) Int. Cl.
*G01N 37/00*   (2006.01)
*G06F 19/00*   (2006.01)

(52) U.S. Cl. ........................................ 702/83; 382/149
(58) Field of Classification Search ................ 702/182, 702/183, 83; 348/129; 356/237.5, 390, 356/394; 377/3.39; 250/565, 5.65
See application file for complete search history.

(56) References Cited

U.S. PATENT DOCUMENTS 4,185,298 A * 1/1980 Billet et al. ................. 348/129
5,455,870 A * 10/1995 Sepai et al. ................. 382/147
7,031,511 B2 * 4/2006 Asai ........................... 382/149

* cited by examiner

*Primary Examiner*—John Barlow
*Assistant Examiner*—Lisa Sievers
(74) *Attorney, Agent, or Firm*—Edward C. Kwok; MacPherson Kwok Chen & Heid LLP

(57) ABSTRACT

A technique for developing an inspection program for a circuit board to be run on an AOI system includes determining a characteristic, such as average gray level, of each window of the circuit board. The positions of the windows are varied slightly to simulate expected errors in the placement of the windows relative to the circuit board. After varying the positions of the windows, the characteristic of each window is determined again. Different values of the characteristic corresponding to slightly different positions are compared for each window. Values that substantially change for a window indicate a strong sensitivity to position. These windows may be reported to a programmer for corrective action.

20 Claims, 4 Drawing Sheets

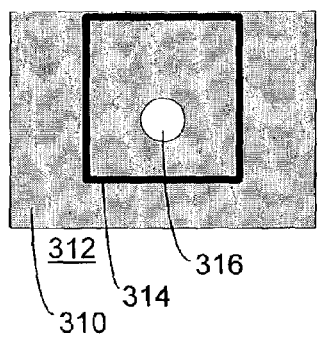
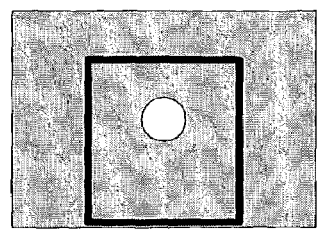
Fig. 3
Fig. 4
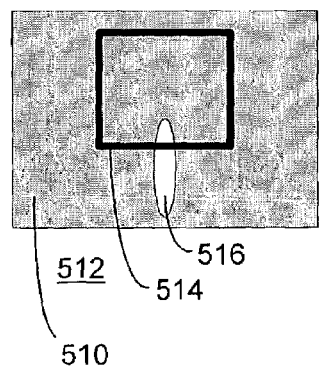
Fig. 5

| Comp | X | Y | Model | Fault Class | Windows | Total Variation |
|---|---|---|---|---|---|---|
| U505 | 1279 | 8141 | TSSOP | Bridge | 121 | 2179 |
| U540 | 6935 | 4687 | BQSOP | Low Sol | 84 | 1500 |
| RS541 | 9129 | 3103 | RSCRA | Bridge | 54 | 1388 |
| U519 | 3302 | 4382 | TSOP50 | Bridge | 48 | 993 |
| U532 | 6353 | 3249 | TQFP | Low Sol | 48 | 902 |
| U504 | 948 | 6522 | TSOP40 | Missing | 37 | 728 |
| RS501 | 1579 | 4175 | RSCRA | Lifted Lead | 34 | 634 |
| U535 | 6597 | 3111 | TSSOP | Low Sol | 25 | 542 |
| R990 | 7119 | 5657 | RSCO603 | Low Sol | 17 | 425 |

INSPECTION WINDOW GUARD BANDING

CROSS-REFERENCES TO RELATED APPLICATIONS

Not Applicable.

Statement Regarding Federally Sponsored Research or Development

Not Applicable.

Reference to Microfiche Appendix

Not Applicable

BACKGROUND OF THE INVENTION

1. Field of the Invention

This invention relates generally to automatic optical inspection systems and methods, and, more particularly, to techniques for reducing the time required to develop reliable inspection programs, particularly those deployed across large numbers of inspection machines.

2. Description of Related Art

Manufacturers of electronic equipment use automatic optical inspection (AOI) to verify the correct construction of circuit board assemblies. FIG. 1 shows a typical AOI system 100 in conceptual form. A circuit board 110 or other assembly is placed securely on a surface, such as an inspection table 112. A camera 114 is suspended above the inspection table 112 from a gantry 116, which moves the camera 114 in increments along X and Y-axes. A processor 118 controls the movement of the gantry via a control line 120 and acquires images from the camera via a data line 122. The AOI system 100 inspects the locations of features on the circuit board 110 with respect to an origin 126, which is generally located at a corner of the circuit board. Circuit boards may also include visual guideposts, called "fiducials," which the inspection system can use to determine position. An example of an AOI system is the Teradyne Optima 7300 post-reflow inspection machine.

During operation of the AOI system 100, the gantry 116 moves the camera 114 over the circuit board 110. The camera 114 scans the circuit board and acquires images. The processor 118 performs calculations on the acquired images.

Often, more than one camera is used for viewing the circuit board from different vantage points. Sometimes the camera(s) move and the circuit board remains stationary. Other times, the circuit board moves and the camera(s) remain stationary.

The techniques of image analysis used in AOI machines are generally based on small regions of interest in a field of view called "inspection windows" or simply "windows." Each window is used to inspect a particular feature of a component on a circuit board. Some windows are used for detecting the bodies of components or their edges. Others are used for evaluating the quantity or quality of solder in the solder joints that connect the components' terminals to the circuit board. Each window is generally defined in terms of its location, shape, size, the type of algorithm used, the camera and kind of lighting used, and other details.

FIG. 2 shows a typical field of view ("FOV"). The FOV 200 includes an array of pixels 210 and various inspection windows 212. A typical FOV is about 2 cm on each side. A typical inspection window is a rectangle or ellipse anywhere from about 1/50 to 1/5 of a millimeter or more in either of its dimensions. For ease of illustration, the relative sizes of the FOV, pixels, and windows shown in FIG. 2 have been greatly distorted.

AOI systems generally evaluate windows by performing simple algorithms. These may include, for example, algorithms for computing average brightness (i.e., gray level) or variance in gray level. AOI systems may also perform more complex algorithms, such as those for identifying features within a window.

AOI machines are usually installed in production lines. The installation or debugging of inspection programs is therefore generally done under tight time constraints. If a machine is tied up debugging an inspection program, an entire assembly line may be stopped, causing large costs to be incurred. The principal consumer of time in debugging an inspection program is evaluating the windows for their ability to discriminate good boards from bad.

A typical inspection program examines about 10,000 windows, and some of the windows are very sensitive to position. Some windows are sensitive by intent, e.g., a programmer may wish to use a window to reject a component that is only slightly misplaced. We have recognized, however, that other windows are unintentionally sensitive. For instance, a window may be located close to, or partly on, a bright printed legend or label on the circuit board. Another window may contain a bright spot at the edge of the window in an otherwise dark field. A very slight error in placement of the window from one board to the next, or from one system to the next, may cause a large shift in the value returned by the algorithm that tests such a window.

One source of error in the placement of windows arises from quantization. The lighting, placement of the camera(s) are controlled digitally, and images recorded by the camera(s) are stored in digital form. It is a well known that the last bit of any digitized representation has an error of at least $+/-\frac{1}{2}$ the value of the least significant bit for that quantity.

Another source of errors is speed. Servo placement is never exact. One can reduce the errors in servo placement if one is willing to wait a longer time for the servo position loops to close, but speed is of the essence in AOI applications, so a band of uncertainty is generally accepted.

Other variations occur between systems. These variations arise because machines cannot be reproduced exactly, but are instead built and calibrated within manufacturing tolerances.

Many production facilities have multiple lines that manufacture the same product. Such is the case in the personal computer, consumer electronics, and automotive electronics industries, where production volumes are generally too high to be sustained by a single production line. In such multiple-line installations, it is important that the AOI machines all use the same inspection program.

It is often difficult to make an inspection program that is repeatable and consistent when deployed across many AOI machines. Even when two machines are identical within their normal manufacturing tolerances, they may still be different enough to cause a sensitive window to read differently. If the differences are large enough, a circuit board that passes on one machine will fail on another.

BRIEF SUMMARY OF THE INVENTION

With the foregoing background in mind, it is an object of the invention to reduce development time of inspection programs by quickly identifying windows that are sensitive to small changes in position.

It is another object of the invention to make inspection programs more transportable between AOI systems.

To achieve the foregoing objects, as well as other objectives and advantages, a technique for developing an inspection program for a circuit board or other assembly to be run on an AOI system includes determining a characteristic of each window (or a subset of windows) of the circuit board. The positions of the windows are varied slightly to simulate expected errors in the placement of the windows relative to the circuit board. After varying the positions of the windows, the characteristic of each window is determined again. If the positions of the windows are varied in multiple directions, the characteristic is determined for each positional variant. Different values of the characteristic are compared for each window. Windows having values that significantly change indicate sensitivity to positional errors. These windows can be reported to allow their sensitivity to be reduced.

BRIEF DESCRIPTION OF THE DRAWINGS

Additional objects, advantages, and novel features of the invention will become apparent from a consideration of the ensuing description and drawings, in which—

FIGS. 3-7 are illustrations of inspection windows for inspecting target objects, which are sensitive to errors in the positioning of the windows;

DETAILED DESCRIPTION OF THE PREFERRED EMBODIMENT

Figure 1:
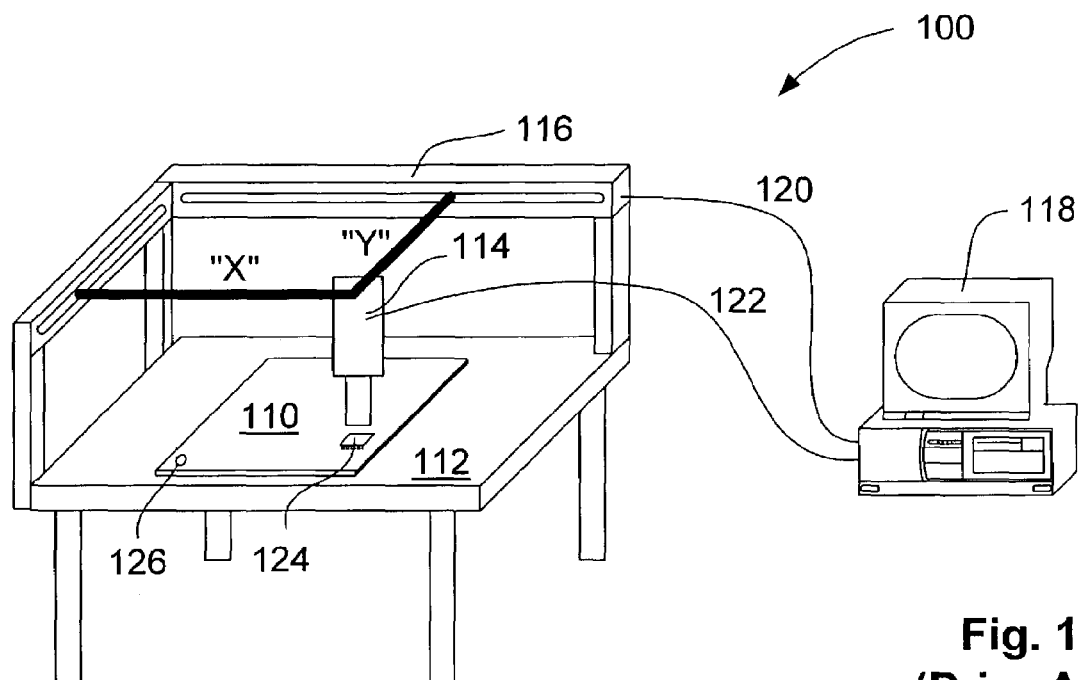
FIG. 1 is a simplified, isometric view of an automated optical inspection (AOI) system according to the prior art for inspecting circuit boards.
Figure 2:
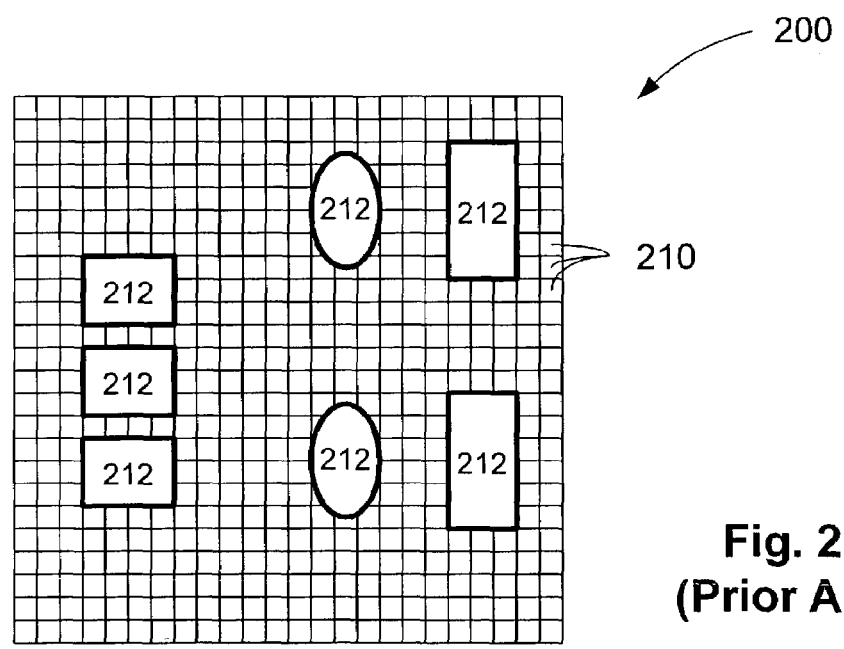
FIG. 2 is an idealized drawing of a field of view acquired by an AOI system, including pixels and inspection windows (not to scale)

Inspection windows for a circuit board may be unintentionally sensitive to position. For example, a small component may be in the shadow of a larger component, and not receive the expected amount of light. A component may be close to a silkscreen legend on the board. A window may only partly cover its intended feature, and give variable results if a few pixels move into or out of the window.

FIG. 3 shows an example of a "nonlinear sensitivity." This type of sensitivity can occur when a window is located close to a sharp boundary between a dark region and a light region, but is intended to fit entirely within one region. Imagine a contrast-sensitive window 314 containing mostly dark pixels, with a small bright region 316 in its middle as the target to be judged. In the illustration at the left of FIG. 3, the window 314 is entirely within a dark region 310. Due to errors in placing the window, however, the window may shift downwardly. In the illustration in the middle of FIG. 3, the bottom edge of the window is nearly touching the boundary on the circuit board between the dark region 310 and the light region 312. In the illustration at the right, the window has crossed partially into the light region 312. At this point, there is a sudden increase in the number of bright pixels within the window, and a sudden increase in measured contrast.

Such a window is unlikely to read the same value from run to run or from machine to machine, since the unintended bright region may randomly intrude into the window, or not. Worse still, the value of the characteristic that this window returns has more to do with the unintended bright pixels than it has to do with the intended target.

FIG. 4 shows an example of "linear sensitivity." Linear sensitivity occurs when a window is located on a boundary between light and dark regions of a circuit board, and normally includes both light and dark regions. As the window 414 is moved downward from the position at left to the position at center, its value changes as it incorporates more bright pixels and loses an equal number of dark ones. As it is moved downward to the position at right, its value changes again, in a continuous fashion. The number of pixels in the intended target 416 is less than the number in the part of the window that extends into the bright zone. Algorithms performed on this window are neither repeatable nor transportable, and the values they produce have more to do with the error in placing the window than with the target 416 they are intended to measure.

FIG. 5 shows an example of an inspection window positioned so that its intended target 516 (an ellipse) is not entirely contained. As the window is moved downward from the position at left to the position at center, its value changes as it incorporates more bright pixels and fewer dark ones. As it is moved downward to the position at right, its value changes again, in a continuous fashion. A window such as this, while not at risk of crossing a boundary, is also at risk of generating a measured value that depends more on its exact instantaneous position than on the quality of the object it is intended to evaluate.

The examples shown in FIGS. 3-5 are essentially one-dimensional, in that the values vary only in the up/down dimension. If these windows were to move side to side, their results would not vary: the windows would include equal numbers of bright and dark pixels regardless of their lateral motion.

Figure 6A:
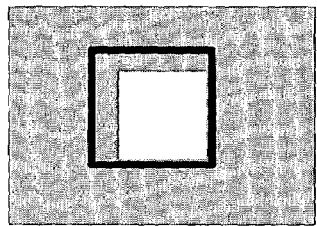
Figure 6B:
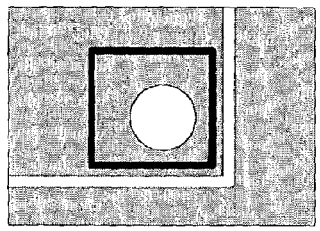
Figure 6C:
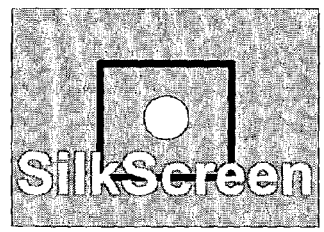

It is also possible to have windows that are threatened from multiple directions, windows that are sandwiched between two or more discontinuities, and windows that contain printed legends and other unexpected clutter. FIG. 6 shows windows in these more challenging locations. A target with straight edges (left) can bring about sensitivity in two directions. White printed silkscreen legends intended to assist human workers (center, right) can interfere with machine measurement if the legends invade windows that would otherwise be trouble-free.

Figure 7:
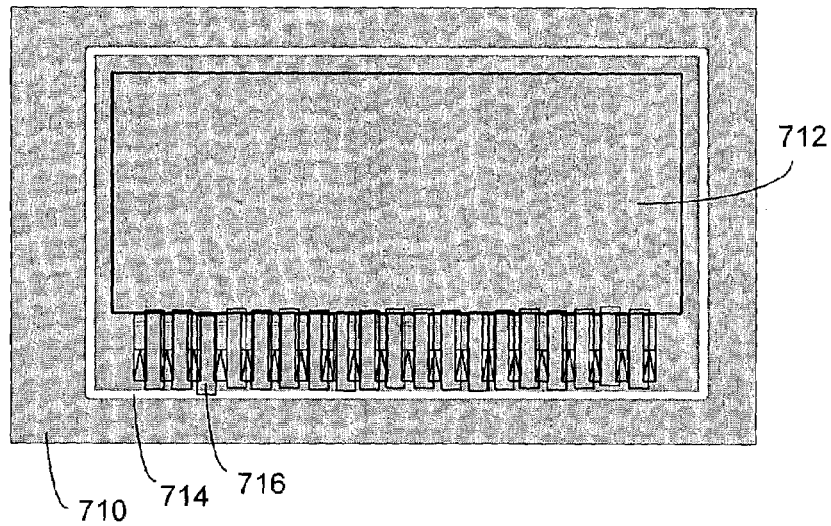

FIG. 7 shows how an error in positioning an inspection window can cause an inspection program to misreport a failure. There is a rectangle 714 of light colored silkscreen paint outlining a component 712. Solder-bridge detection windows 716 are represented as black rectangles covering the gaps between the component's leads. If any of these windows happens to dip into the silkscreen rectangle (as the third window from the left has done), the program may falsely report a solder bridge.

Figures 8, 9:
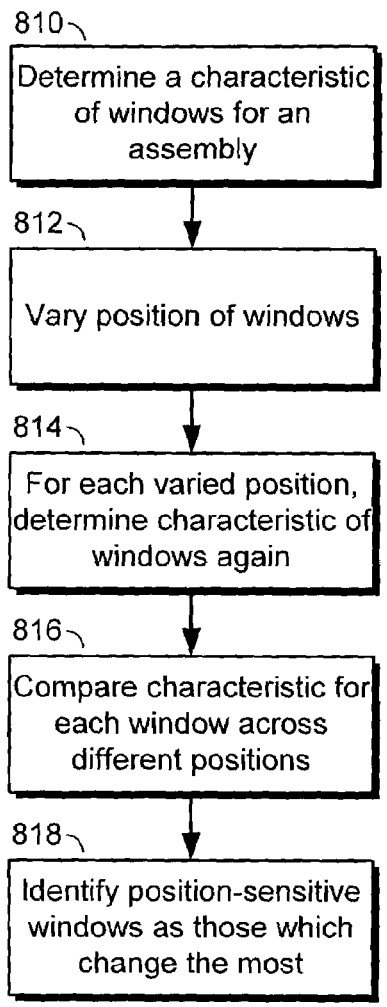
FIG. 8 is a simplified flow chart of a process according to the invention for identifying position-sensitive windows used in an inspection program.
FIG. 9 is an example of an interactive display for identifying position-sensitive windows on a circuit board.

FIG. 8 is a flow chart of a process according to the invention for identifying sensitive inspection windows, such as those indicated in FIGS. 3-7.

At step 810, a characteristic of the windows of a circuit board are determined. The characteristic may correspond to the average gray level of the pixels in the window, variance in the gray level, or other aspects of the pixels within the window. If desired, multiple characteristics may be determined. In the preferred embodiment, the selected characteristic(s) are determined for all inspection windows of the circuit board. This is not strictly required, however, and a subset of the windows can be used instead.

Information about the windows themselves is generally available from a library of components. A machine readable file containing the names, types, locations and orientations of components is always available, either from the CAD (computer-aided design) files or from a neighboring pick-and-place machine which assembles the components onto the board. By combining library information with CAD information, the AOI programming system software quickly composes the list of windows needed for inspecting the board.

At step 812, the positions of the windows are varied. Once the pixels for a given FOV containing windows are stored in a processor memory, the window positions can be varied, in effect, simply by giving the measurement algorithm a different starting address in memory. The change in starting address corresponds to the amount of variation in the placement of the windows.

Clearly, there could be other ways of varying the locations of the windows. For example, the servos of the AOI machine can be driven to slightly different positions, by moving the camera(s) with respect to the circuit board, or vice versa. In addition, noise inherent in the machine may be used as a perturbing signal to effectively vary the locations of the windows.

The positions of the windows are preferably varied at least four times: once left, once right, once up, and once down. Preferably, window locations are varied between 1 and 3 pixels in each direction, although the optimal amount of change will vary based on conditions, such as image resolution, window size, and expected system errors.

At step 814, the characteristic(s) of the windows determined at step 810 are determined again for each of the varied positions of each window. A quick way to obtain varied values for linear algorithms is to operate the analysis algorithm incrementally. When perturbing the window one pixel rightward, adjust the value by adding in the effect of new pixels brought in from the right and removing the effect of the old pixels shed off from the left. Similar operations can be done when perturbing leftward, upward, downward, and at angles. The incremental method is usually faster, since it does not need to include in its computation all the pixels in the middle of the window time after time.

At step 816, the characteristic(s) for each window are compared across the different window positions. Comparisons can be made in a variety of ways, and the particular manner of comparison is not critical to the invention. One way of comparing characteristics is to use peak-to-peak differences across all the values for each window. Preferably, however, a vector is computed that identifies both the magnitude and the direction of sensitivity.

At step 818, position-sensitive windows are identified. These are the windows for which the characteristic(s) change significantly for the different positions. Preferably, the identities of these position-sensitive windows are fed back to the programmer to allow the inspection procedure to be adjusted.

The computer processor resident in the AOI system preferably conducts the process shown in FIG. 8. The computer processor need not be part of the AOI system, however. Since the process of FIG. 8 can operate on image data previously taken from an AOI system, the process may alternatively be conducted remotely, such as using a personal computer on the programmer's desk.

A software program preferably executes the process on the image data. The program may be implemented with encoded instructions written in any suitable computer language, such as "C," "Visual C++," or "Visual Basic" ("Visual C++" and "Visual Basic" are registered trademarks of Microsoft Corporation of Redmund, Wash.). The program may be implemented in any suitable form, such as a stand-alone executable, a function in a library, of a procedure in an inspection program.

The software program preferably includes interactive features to assist the programmer in zeroing in on sensitive windows. FIG. 9 shows an interactive grid that is preferably displayed and managed by the software program. The inspection program in this example has over 10,000 windows. The programmer can make collections and sort them by component, model or fault class. After collecting, the programmer can sort by component name, X-position, Y-position, model name, or fault class, to look for patterns. The grid shown in FIG. 9 is collected by component name and sorted by component name. The components having the most variation in all their pins combined are placed at the top of the grid. Note that some models are represented more than once. If the programmer sorts this collection by model name instead of by component, the programmer will likely notice that model RSCRA as a problem worth solving, as the separate entries for RSCRA will appear next to each other.

In the preferred embodiment, the interactive grid is integrated with other components used in developing inspection programs. For example, if the programmer clicks the mouse on U505, a program editor will be invoked, which presents U505 for viewing and editing. If the programmer clicks the mouse on TSSOP in the library column, the library editor will be invoked, which will present the TSSOP model for viewing and editing.

It is up to the programmer to adjust the size, shape, and/or placement of windows. The software guides the programmer to take the necessary action. Once the programmer has decided on a component, a library model, or an individual window to work on, the programmer can select the item and choose to go straight to a programmer's view. In this view, the FOV of the board is displayed, as it is when the window in question is typically imaged. The window in question is highlighted to draw the attention of the programmer. If the directional sensitivity calculations have been performed, an arrow (vector) showing the direction of greatest change is drawn in the orientation of greatest change, with the point of the arrow indicating the direction of increase. If several similar windows in this view are affected, they are also highlighted, but not "selected."

It is not very productive to edit an inspection program window by window. Most editing is therefore done at the component or library level. It is here where the greatest leverage is obtained. By correcting the offending component at the library level, rather than at the component level, all affected components of this type are simultaneously corrected.

When the programmer selects a component or library from a list of groupings, the AOI machine's editor opens, and places its focus on the affected component or library item. This direct coupling of the sensitivity data to the editing of the program is an important productivity tool.

Once the programmer has competed an editing session, the programmer should run the process of FIG. 8 again to assess the progress toward a stable, repeatable and transportable program. The programmer will have created a guard band around each window in the inspection program, so that expected random perturbations in machine performance will not cause unexpected variations in the judgment of the machine.

While the invention has been particularly shown and described with reference to the preferred embodiments thereof, it will be understood by those skilled in the art that various changes in form and detail may be made therein without departing from the spirit and scope of the invention.

What is claimed is:

1. A method of developing an inspection program to be run on an automatic optical inspection machine, comprising:
   computing at least one characteristic of each of a plurality of inspection windows for a circuit board;
   varying the positions of the inspection windows to simulate an expected error in placing the inspection windows with respect to the circuit board;
   re-computing the at least one of characteristic of each of the plurality of inspection windows in their varied positions;
   identifying position-sensitive inspection windows responsive to changes in the at least one characteristic after the step of varying; and
   providing an interactive tool for editing the position-sensitive inspection windows.

2. A method as recited in claim 1, wherein the editing comprises changing the position, size, and/or shape of at least one position-sensitive inspection window to reduce sensitivity to errors in placement.

3. A method as recited in claim 2, wherein the step of changing the position, size, and/or shape comprises changing a device model that defines inspection windows for all devices of a particular type, which is used on the circuit board.

4. A method as recited in claim 2, further comprising inspecting an actual circuit board with changed values for position, size, and/or shape.

5. A method as recited in claim 4, further comprising inspecting different circuit boards of the same type as the actual circuit board on different inspection systems using the same changed values for position, size, and/or shape.

6. A method as recited in claim 1, wherein the at least one characteristic of the plurality of inspection windows comprises any of an average gray level of each inspection window, a variance of gray level within each inspection window, and a determination of shapes within each inspection window.

7. A method as recited in claim 1, wherein the step of varying comprises changing the positions of the plurality of inspection windows in any of a horizontal and/or vertical direction.

8. A method as recited in claim 1, wherein the step of varying comprises changing the positions of the plurality of inspection windows by the same amount and in the same direction for all of the plurality of inspection windows.

9. A method as recited in claim 1, further comprising computing a magnitude of change in the at least one characteristic responsive to the step of varying.

10. A method as recited in claim 9, further comprising computing a direction of change in the at least one characteristic responsive to the step of varying.

11. A method for developing an inspection program to be run on an automatic optical inspection machine, comprising:
    computing at least one characteristic of each of a plurality of inspection windows for a circuit board;
    varying the positions of the inspection windows to simulate an expected error in placing the inspection windows with respect to the circuit board;
    re-computing the at least one of characteristic of each of the plurality of inspection windows in their varied positions; and
    identifying position-sensitive inspection windows responsive to changes in the at least one characteristic after the step of varying; and
    displaying a list of inspection windows for a circuit board ordered by their sensitivity to changes in position.

12. A method for developing an inspection program to be run on an automatic optical inspection machine, comprising:
    computing at least one characteristic of each of a plurality of inspection windows for a circuit board:
    varying the positions of the inspection windows to simulate an expected error in placing the inspection windows with respect to the circuit board;
    re-computing the at least one of characteristic of each of the plurality of inspection windows in their varied positions;
    identifying position-sensitive inspection windows responsive to changes in the at least one characteristic after the step of varying;
    capturing at least one image of the circuit board; and
    storing the at least one image as a plurality of pixels in a memory;
    wherein the step of varying comprises changing a starting address in the memory at which the step of re-computing is to be conducted.

13. A software tool for developing and/or debugging an inspection program for an automatic inspection system that inspects an assembly by examining a plurality of inspection windows of the assembly, the plurality of inspection windows corresponding to areas of interest on the assembly, comprising:
    encoded instructions for determining at least one characteristic of the plurality of inspection windows;
    encoded instructions for shifting the position of each of the plurality of inspection windows in at least one direction to simulate an error in placing the window with respect to the assembly;
    encoded instructions for re-determining the at least one characteristic of the plurality of inspection windows;
    encoded instructions for comparing the at least one characteristic of the plurality of windows before and after the plurality of windows are shifted and
    encoded instructions for providing a an interactive tool for editing the position-sensitive inspection windows.

14. A software tool as recited in claim 13, further comprising:
    encoded instructions for identifying any of the plurality of windows as position sensitive responsive to a change in the least one characteristic.

15. A software tool as recited in claim 13, wherein the encoded instructions for providing an interactive tool includes encoded instructions for changing the position, size, and/or shape of inspection windows to reduce their sensitivity to position.

16. A software tool as recited in claim 13, further comprising encoded instructions for computing any of the magnitude and direction of changes in the at least one characteristic.

17. A software tool for developing and/or debugging an inspection program for an automatic inspection system that inspects an assembly by examining a plurality of inspection windows of the assembly, the plurality of inspection windows corresponding to areas of interest on the assembly, comprising:
    encoded instructions for determining at least one characteristic of the plurality of inspection windows;
    encoded instructions for shifting the position of each of the plurality of inspection windows in at least one direction to simulate an error in placing the window with respect to the assembly;

encoded instructions for re-determining the at least one characteristic of the plurality of inspection windows;

encoded instructions for comparing the at least one characteristic of the plurality of windows before and after the plurality of windows are shifted; and encoded instructions for displaying a list of inspection windows of the assembly ordered by their sensitivity to changes in position.

18. An automatic inspection system for optically examining electronic assemblies, comprising:

a surface upon which to place an assembly under inspection;

at least one camera, the at least one camera and the surface being moveable relative to each other to enable the at least one camera to examine a plurality of inspection windows of the assembly under inspection;

a memory for storing images acquired by the at least one camera; and a processor for executing software, said processor performing the steps of:

computing at least one characteristic of each of the plurality of inspection windows of the assembly;

varying the position of each of the plurality of windows in at least one direction to simulate an error in placing the inspection window with respect to the assembly;

re-computing the at least one characteristic of the plurality of inspection windows; and identifying any of the plurality of inspection windows as position-sensitive responsive to a change in the at least one characteristic.

19. An automatic inspection system as recited in claim 18, wherein inspection windows are identified as groups of pixels within the memory, and the step of varying comprises shifting each group of pixels within the memory by a predetermined number of pixels in at least one direction.

20. An automatic inspection system as recited in claim 18, wherein the step of varying comprises moving the at least one camera and the surface with respect to each other and acquiring at least one new image.

* * * * *